(12) United States Patent
Estelle et al.

(10) Patent No.: US 12,405,319 B2
(45) Date of Patent: Sep. 2, 2025

(54) SYSTEMS AND METHODS FOR DIRECT HEATER DIAGNOSTICS FOR A HOT MELT LIQUID DISPENSING SYSTEM

(71) Applicant: Nordson Corporation, Westlake, OH (US)

(72) Inventors: Peter W. Estelle, Duluth, GA (US); Michael J. Palmer, Duluth, GA (US)

(73) Assignee: Nordson Corporation, Westlake, OH (US)

( * ) Notice: Subject to any disclaimer, the term of this patent is extended or adjusted under 35 U.S.C. 154(b) by 233 days.

(21) Appl. No.: 17/761,870

(22) PCT Filed: Sep. 16, 2020

(86) PCT No.: PCT/US2020/050983
§ 371 (c)(1),
(2) Date: Mar. 18, 2022

(87) PCT Pub. No.: WO2021/055412
PCT Pub. Date: Mar. 25, 2021

(65) Prior Publication Data
US 2022/0373614 A1   Nov. 24, 2022

Related U.S. Application Data

(60) Provisional application No. 62/903,423, filed on Sep. 20, 2019.

(51) Int. Cl.
*G01R 31/56* (2020.01)
*B05C 5/00* (2006.01)
(Continued)

(52) U.S. Cl.
CPC .............. *G01R 31/56* (2020.01); *B05C 5/001* (2013.01); *B05C 11/1042* (2013.01);
(Continued)

(58) Field of Classification Search
CPC .............. G01R 19/12; G01R 19/16571; G01R 19/16576; G01R 31/52; G01R 31/56;
(Continued)

(56) References Cited

U.S. PATENT DOCUMENTS 4,716,519 A   12/1987   Locke et al.
6,336,083 B1 *  1/2002   Lanham .................. H05B 1/00
                                                    361/7
(Continued)

FOREIGN PATENT DOCUMENTS

CN   101133367 A   2/2008
CN   103769348 A   5/2014
(Continued)

OTHER PUBLICATIONS

IPEA/409—International Preliminary Report on Patentability Mailed on Jan. 5, 2022 for WO Application No. PCT/US20/050983.
(Continued)

*Primary Examiner* — Steven L Yeninas
(74) *Attorney, Agent, or Firm* — BakerHostetler

(57) ABSTRACT

Systems and methods for direct heater diagnostics for a hot melt liquid dispensing system are disclosed. At least one of a current measurement or a voltage measurement is received from a respective current and/or voltage sensor positioned at an electrical circuit that supplies electric power to a heater associated with the dispensing system. The heater can be for an applicator or heated hose attached to the dispensing system, a melter of the dispensing system, or a pump of the dispensing system. A state of the electrical circuit is determined based on the at least one of the current or voltage measurement.

26 Claims, 7 Drawing Sheets

(51) Int. Cl.
  *B05C 11/10* (2006.01)
  *G01R 19/12* (2006.01)
  *G01R 19/165* (2006.01)
  *G01R 31/50* (2020.01)

(52) U.S. Cl.
  CPC ....... *G01R 19/12* (2013.01); *G01R 19/16571* (2013.01); *G01R 19/16576* (2013.01); *G01R 31/50* (2020.01)

(58) Field of Classification Search
  CPC ....... B05C 5/001; B05C 11/1042; B05B 9/01; B05B 15/18; H05B 1/02
  See application file for complete search history.

(56) References Cited

U.S. PATENT DOCUMENTS

| | | | |
|---|---|---|---|
| 6,760,625 B1 * | 7/2004 | Kroll | A61N 1/3708 |
| | | | 607/29 |
| 7,289,878 B1 | 10/2007 | Estelle et al. | |
| 7,351,937 B2 | 4/2008 | Heerdt et al. | |
| 9,119,230 B2 | 8/2015 | Brudevold | |
| 2001/0023876 A1 | 9/2001 | Estelle et al. | |
| 2005/0030185 A1 * | 2/2005 | Huisenga | G08C 19/02 |
| | | | 340/635 |
| 2005/0067401 A1 | 3/2005 | Fernandez et al. | |
| 2006/0249532 A1 | 11/2006 | Bourget et al. | |
| 2006/0289566 A1 * | 12/2006 | Heerdt | G05D 23/1934 |
| | | | 222/146.5 |
| 2014/0117050 A1 * | 5/2014 | Beal | B29B 13/022 |
| | | | 222/23 |
| 2015/0264745 A1 | 9/2015 | Brudevold | |
| 2016/0377671 A1 * | 12/2016 | Sjoroos | G01R 31/2642 |
| | | | 324/762.01 |
| 2018/0275185 A1 * | 9/2018 | Essawy | G01K 15/007 |
| 2019/0244445 A1 * | 8/2019 | Kyes | B60W 50/0205 |
| 2019/0304849 A1 * | 10/2019 | Cheong | G06N 20/20 |
| 2019/0324088 A1 * | 10/2019 | Andersson | G01R 31/371 |
| 2020/0264229 A1 * | 8/2020 | Wardhan | G01R 31/2882 |
| 2021/0136872 A1 * | 5/2021 | Tsubata | H05B 1/02 |
| 2022/0057111 A1 * | 2/2022 | Porwal | G08B 21/182 |

FOREIGN PATENT DOCUMENTS

| | | |
|---|---|---|
| CN | 104755176 A | 7/2015 |
| EP | 0080795 A1 | 6/1983 |
| EP | 0333233 A2 | 9/1989 |
| EP | 1155746 A2 | 11/2001 |
| EP | 1442798 A2 | 8/2004 |
| EP | 2724783 A2 | 4/2014 |
| JP | 62-172680 A | 7/1987 |
| JP | 11-006812 A | 1/1999 |
| JP | 2002-018332 A | 1/2002 |
| JP | 2004-255374 A | 9/2004 |
| JP | 2008-541352 A | 11/2008 |
| JP | 2014-083540 A | 5/2014 |

OTHER PUBLICATIONS

ISA/220—Notification of Transmittal or Search Report and Written Opinion of the ISA, or the Declaration Mailed on Jan. 12, 2021 for WO Application No. PCT/US20/050983.

* cited by examiner

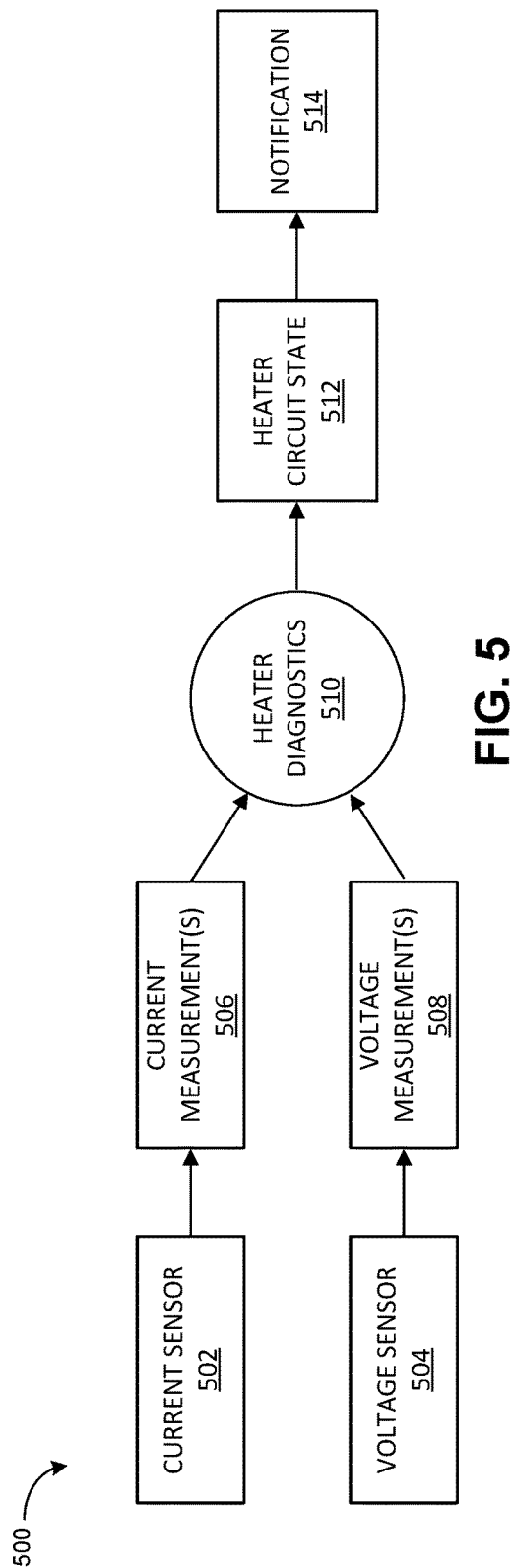
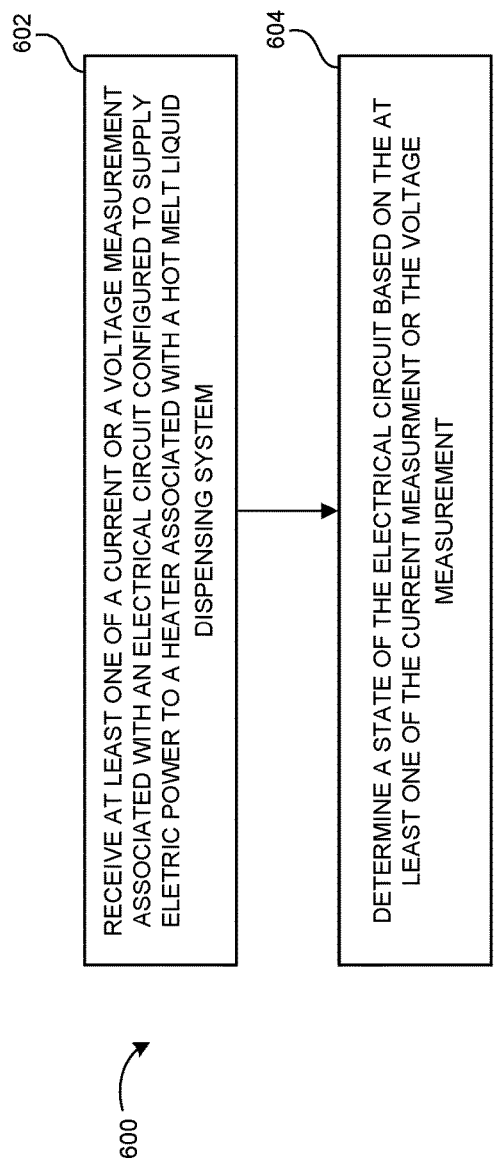

SYSTEMS AND METHODS FOR DIRECT HEATER DIAGNOSTICS FOR A HOT MELT LIQUID DISPENSING SYSTEM

CROSS-REFERENCE TO RELATED APPLICATIONS

This application is a National Stage Application of International Patent Application No. PCT/US2020/050983, filed Sep. 16, 2020, claims priority to U.S. Provisional Application No. 62/903,423 filed Sep. 20, 2019, which is incorporated by reference in its entirety.

TECHNICAL FIELD

This disclosure generally relates to liquid dispensing and, more particularly, to direct diagnostics associated with a heater and related components of a hot melt liquid dispensing system.

BACKGROUND

Hot melt liquid dispensing systems find use in a variety of applications. For example, such a system may apply hot melt adhesives during the manufacture of disposable hygiene products. As another example, a hot melt liquid dispensing system may apply hot melt adhesive to assemble and/or seal various types of packaging, such as paper-based packaging for food and beverages.

In an example configuration of a hot melt liquid dispensing system, a solid form of hot melt adhesive is supplied to a melter comprising a heated reservoir and/or a heated grid to produce molten hot melt adhesive. After heating, the molten adhesive may be pumped through a heated hose to an applicator, which is sometimes referred to as a dispensing "gun" or a gun module, comprising a valve and a nozzle. The applicator then dispenses the supplied molten adhesive to the desired surface or substrate, often as a series of dots or lines. In many applications, the adhesive should be applied with precise positioning, timing, and volume. For example, an insufficient volume of dispensed adhesive may result in ineffective bonds while an excessive volume of adhesive may result in not only wasted material but also undesirable flow once the adhesive is applied to a surface.

The proper operation of the various heater components of a hot melt liquid dispensing system is one significant factor, among others, for achieving the desired results in dispensed adhesive. For example, a malfunctioning heater component may fail to raise and/or maintain molten adhesive at a specified temperature, thereby resulting in molten adhesive with too high of a viscosity. This, in turn, may negatively affect the volume and placement of dispensed adhesive. Conversely, molten adhesive that is too hot may be insufficiently viscous. This may cause, for example, an excess quantity of fluid to be applied to a surface in each dispensing cycle. Low viscosity may also cause the dispensed adhesive to exhibit undesirable flow once applied to a surface. Excess heat applied to molten adhesive, such as in the melter, may also cause charring. Charred adhesive may result in clogged filters and applicators, discoloration in dispensed adhesive, and broken seals.

Yet diagnoses of the various faults that may occur in the heater components and associated circuits may present a number of challenges. For example, a fault may not be evident for some time after it has occurred. Several minutes may pass before the actual adhesive dispensing is negatively affected by the heater fault, for instance. It even may not be immediately clear which of the various heater components involved (e.g., the applicator heater, the hose heater, or the melter heater) suffered the fault. In these cases, any problem with the heater components or associated circuits may have to be indirectly inferred based on, for example, temperature behavior. Efficient heater diagnostics may also require significant training and expertise on the part of the operator.

These and other shortcomings are addressed in the present disclosure.

SUMMARY

Disclosed herein are system and methods for direct diagnostics associated with a heater and related components of a hot melt liquid dispensing system.

An example hot melt liquid dispensing system may comprise a melter configured to melt solid or semi-solid material into hot melt liquid. The hot melt liquid dispensing system may comprise an electrical circuit configured to supply electric power to a heater associated with the hot melt liquid dispensing system. The electrical circuit may comprise at least one of a current sensor or a voltage sensor. The hot melt liquid dispensing system may comprise a controller. The controller may be configured to receive, from the at least one of the current sensor or the voltage sensor, at least one of a current measurement or a voltage measurement. The controller may be further configured to determine a state of the electrical circuit based on the at least one of the current measurement or the voltage measurement.

In an example method, at least one of a current measurement or a voltage measurement may be received. The at least one of the current measurement or the voltage measurement may be associated with an electrical circuit configured to supply electric power to a heater associated with a hot melt liquid dispensing system. A state of the electrical circuit may be determined based on the at least one of the current measurement or the voltage measurement.

BRIEF DESCRIPTION OF DRAWINGS

The accompanying drawings, which are incorporated in and constitute a part of this specification, illustrate embodiments and together with the description, serve to explain the principles of the methods and systems:

FIG. 5 illustrates a data flow diagram according to an embodiment of the present disclosure; and FIG. 6 illustrates a method flow diagram according to an embodiment of the present disclosure.

Aspects of the disclosure will now be described in detail with reference to the drawings, wherein like reference numbers refer to like elements throughout, unless specified otherwise.

DETAILED DESCRIPTION

Figure 1A:
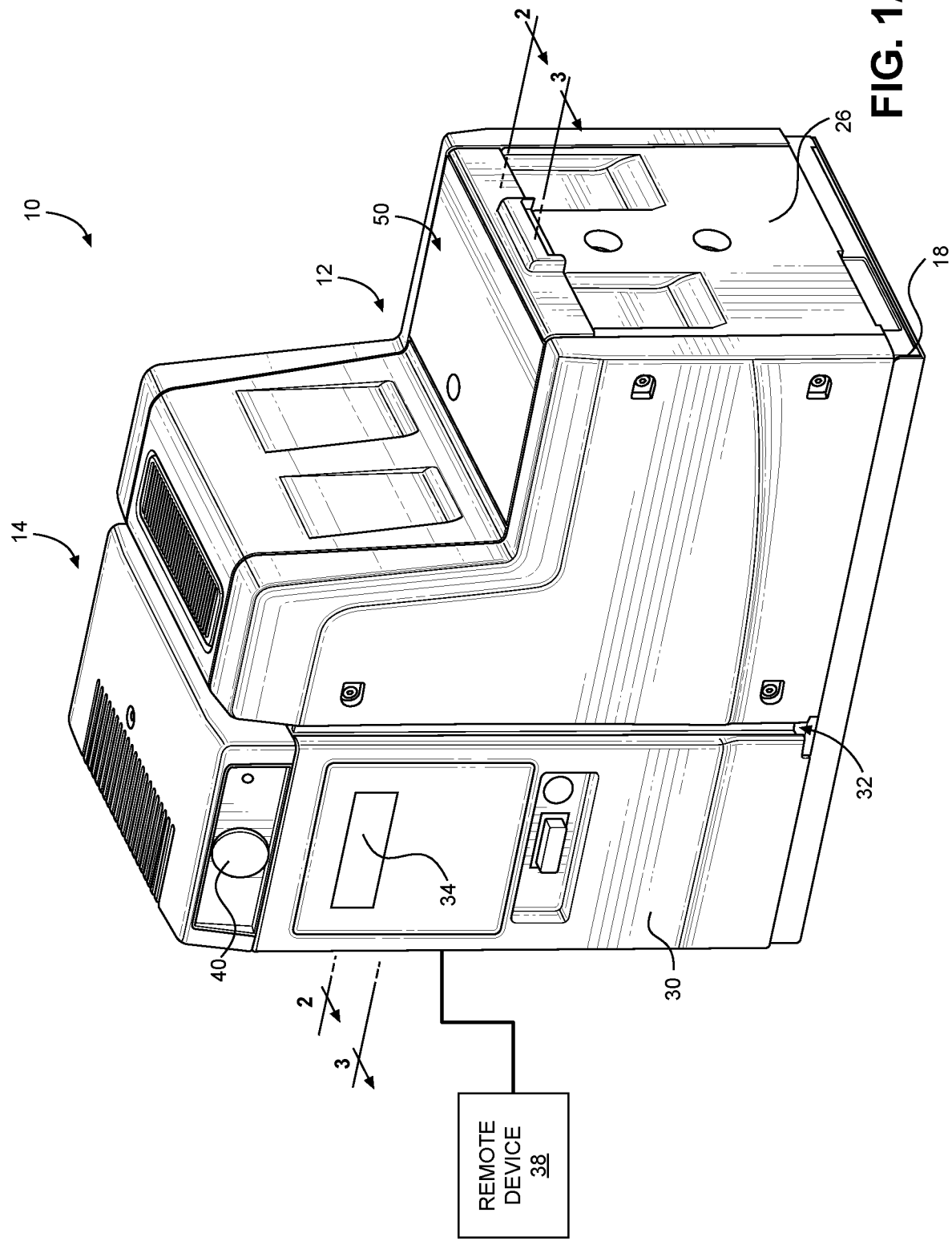
FIG. 1A illustrates a perspective view of an adhesive dispensing device according to an embodiment of the present disclosure.
Figure 1B:
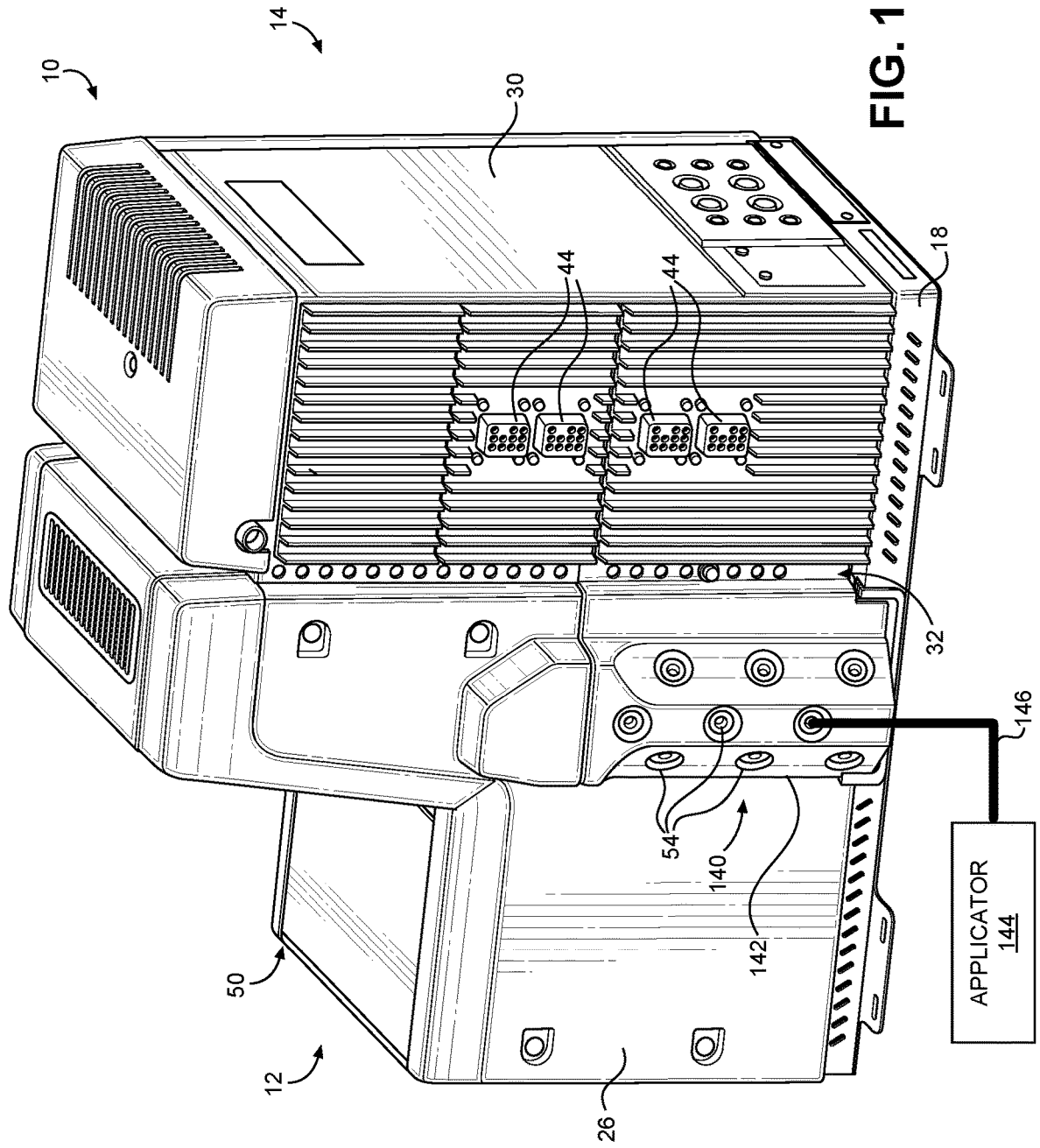
FIG. 1B illustrates an alternative perspective view of the adhesive dispensing device shown in FIG. 1A.

The systems and methods of the present disclosure relate to diagnostic techniques for a heater and associated components and elements of hot melt liquid dispensing system. Although referred to variously as "heater diagnostics," the techniques described herein are not limited to diagnostics directed to a heater or heater system as a whole, but may also be used to diagnose various faults, conditions, etc. of any component, sub-component, or element that is associated with a heater or heater system. This includes heating elements, circuits, wires, conductors, traces (e.g., PCB copper traces), fuses, power control switches, or any components, sub-components, or elements that interacts with or affects heater operations. For example, the diagnostic techniques described herein may detect an open heating element or a blown fuse. As another example, the diagnostic techniques may detect a broken or disconnected wire leading from a temperature control board to a heating element.

Referring to FIGS. 1A-3, an adhesive dispensing device 10 in accordance with one embodiment of the invention is shown. The adhesive dispensing device 10 includes a melt module 12 and a control module 14 electrically and/or physically coupled to the melt module 12. The melt module 12 is configured to include the components related to receiving solid adhesive and melting the solid adhesive, whereas the control module 14 is configured to include the electronic components for controlling operation of the melt module 12, where each of the melt module 12 and the control module 14 will be described in detail further below. Each of the melt module 12 and the control module 14 may be mounted to and supported by a base 18. The base 18 may comprise a metal body and is configured to releasably couple to each of the melt module 12 and the control module 14, such as through fasteners that may comprise bolts, screws, etc., though it is contemplated that the melt module 12 and the control module 14 may be alternatively coupled to the base 18 in other embodiments.

When the melt module 12 and the control module 14 are coupled to the base 18, a thermal gap 32 may be defined between the melt module 12 and the control module 14. The thermal gap 32 may be configured to minimize and/or substantially eliminate heat transfer from the melt module 12 to the control module 14 so as to prevent damage to the electronic components contained by the control module 14 caused by the heat created by the melt module 12. The thermal gap 32 may comprise a space between the melt module 12 and the control module 14. Additionally, it is contemplated that the thermal gap 32 may further include materials configured to prevent heat transfer, such as various types of insulation, though any specific type of material or structure is not required.

Figure 1C:
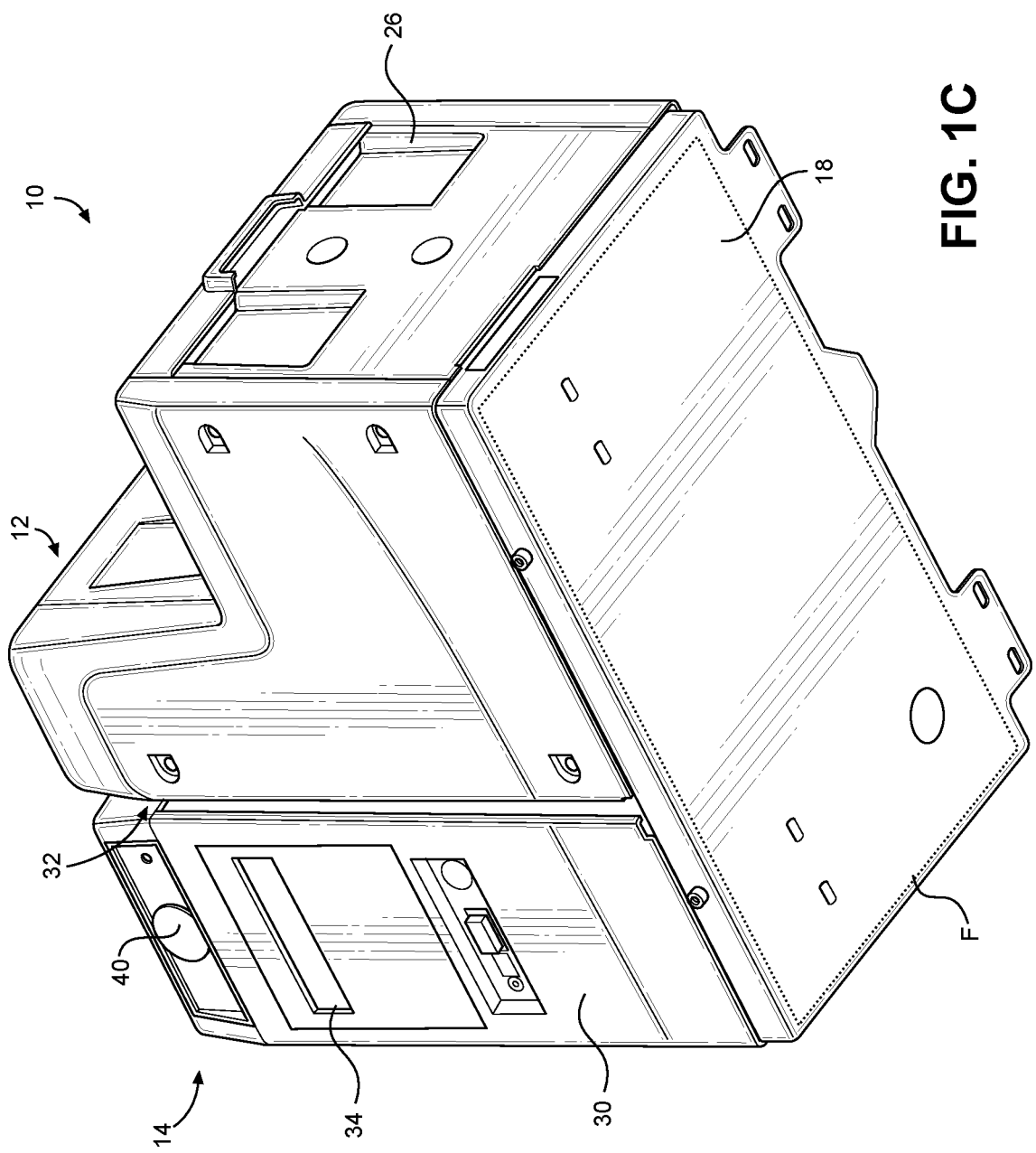
FIG. 1C illustrates another alternative perspective view of the adhesive dispensing device shown in FIG. 1A.
Figure 2:
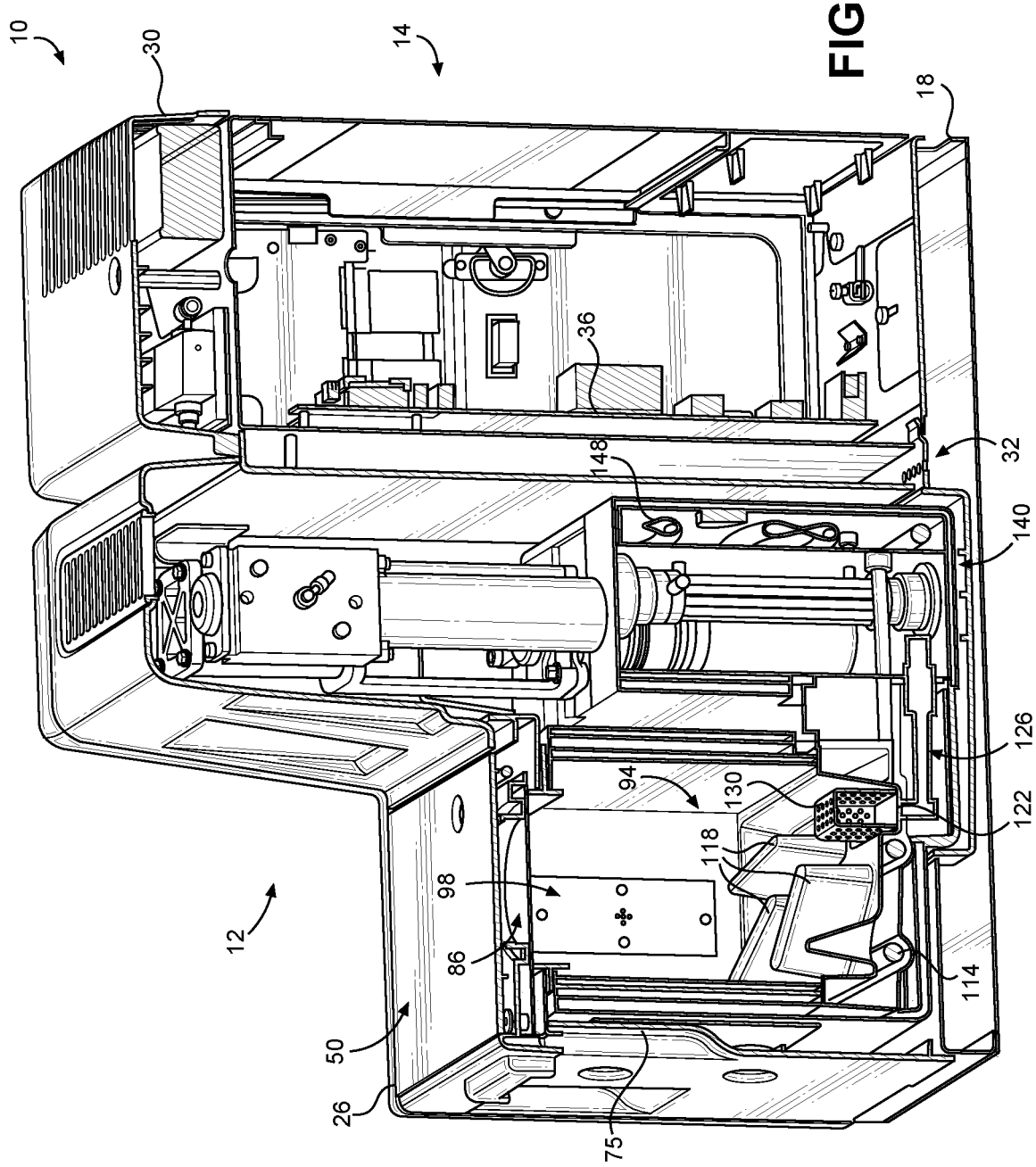
FIG. 2 illustrates a cross-sectional view of the adhesive dispensing device shown in FIG. 1A, taken along line 2-2 shown in FIG. 1A.
Figure 3:
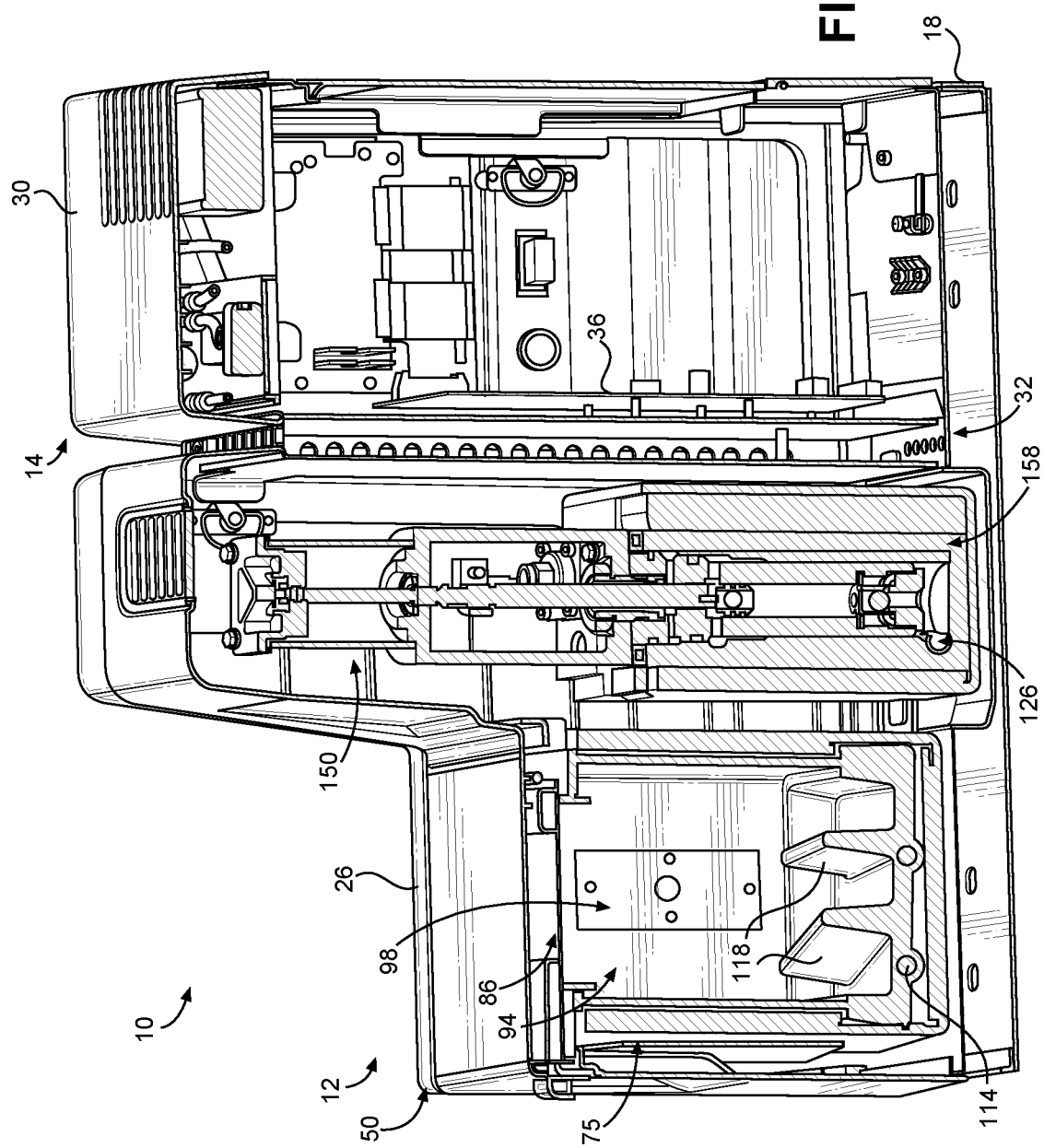
FIG. 3 illustrates an alternative cross-sectional view of the adhesive dispensing device shown in FIG. 1A, taken along line 3-3 shown in FIG. 1A.

As shown in FIG. 1C, the adhesive dispensing device 10 may define a specific footprint F. The lower end of the base 18 may define the footprint F, which may be defined as a cross-sectional shape and area defined by the lower end of the base 18. The footprint F may also, additionally or alternatively, be defined by the collective lower ends of the melt module 12 and the control module 14.

The adhesive dispensing device 10 may include a melt module cover 26 and a control module cover 30 configured to provide selective access to the melt module 12 and the control module 14, respectively. The melt module cover 26 is configured to house the components of the melt module 12 and at least partially insulate the melt module 12 from the surrounding environment, while the control module cover 30 is configured to house the components of the control module 14, as well as insulate the control module 14 from the melt module 12 and the surrounding environment. The previously-described thermal gap 32 may be specifically defined between the melt module cover 26 and the control module cover 30.

The control module 14 may include a controller 36. The controller 36 may comprise any suitable computing device configured to host a software application for monitoring and controlling various operations of the adhesive dispensing device 10 as described herein. It will be understood that the controller 36 may include any appropriate integrated circuit. Specifically, the controller 36 may include a memory and be in signal communication with a human-machine interface (HMI) device 34. The memory may be volatile (such as some types of RAM), non-volatile (such as ROM, flash memory, etc.), or a combination thereof. The controller 36 may include additional storage (e.g., removable storage and/or non-removable storage) including, but not limited to, tape, flash memory, smart cards, CD-ROM, digital versatile disks (DVD) or other optical storage, magnetic tape, magnetic disk storage or other magnetic storage devices, universal serial bus (USB) compatible memory, or any other medium which may be used to store information and which may be accessed by the controller 36. The memory of the controller 36 may be configured to store and recall on demand various metering operations to be performed by the adhesive dispensing device 10. The control module 14 may further include electrical connections 44 extending through the control module cover 30, which may be configured to establish a connection with an applicator and/or heated hose so as to transmit power to the applicator and/or hosed hose and exchange communication signals.

As noted above, the control module 14 may include an HMI device 34 in signal communication with the controller 36. In the depicted embodiment, the HMI device 34 may include a display, such as an OLED screen. However, it is contemplated that the HMI device 34 may also include, in addition or alternatively, various types of inputs that provide the ability to control the controller 36, via, for example, buttons, soft keys, a mouse, voice actuated controls, a touch screen, movement of the controller 36, visual cues (e.g., moving a hand in front of a camera on the controller 36), or the like. The HMI device 34 may provide outputs via a graphical user interface, including visual information, such as the visual indication of the current conditions within the adhesive dispensing device 10, as well as acceptable ranges for these parameters via a display. Other outputs may include audio information (e.g., via speaker), mechanically (e.g., via a vibrating mechanism), or a combination thereof. In various configurations, the HMI device 34 may include a display, a touch screen, a keyboard, a mouse, a motion detector, a speaker, a microphone, a camera, or any combination thereof. The HMI device 34 may further include any suitable device for inputting biometric information, such as, for example, fingerprint information, retinal information, voice information, and/or facial characteristic information, for instance, so as to require specific biometric information for accessing the controller 36. In addition to the HMI device 34, the control module 14 may include a pressure dial 40 for easily displaying pressure readings, such as air pressure readings.

Additionally, the controller 36 may be in signal communication with a remote device 38 (shown in schematic in FIG. 1A) spaced from the control module 14. In one embodiment, the remote device 38 may comprise a display spaced from the control module 14, such as an OLED display, though various types of conventional displays are contemplated. Alternatively, the remote device 38 may comprise an external computing device, examples of which include a processor, a desktop computing device, a server computing device, or a portable computing device, such as a laptop, tablet, or smart phone. Accordingly, the remote device 38 may provide the operator with the ability to interact with and control the controller 36 at a distance from the adhesive dispensing device 10. The remote device 38 may be used as part of a cloud control system for the adhesive dispensing device 10.

The melt module 12 will be described in greater detail. The melt module 12 comprises a melter subassembly 75 configured to receive solid or semi-sold pellets of adhesive material, either from manual filling by opening a lid assembly 50 or through an automatic fill mechanism. The melter subassembly 75 may heat the pellets to a specified temperature to form molten adhesive. The melt module 12 may also include a pump 150 configured to pressurize and dispense the molten adhesive to one or more downstream applicators 144 (shown in schematic in FIG. 1B). An applicator 144 may also be known as a dispenser gun. An applicator 144, as used herein, may refer to an applicator module configured with a bank of applicators.

The melt module 12 may include a manifold 140 configured to receive pressurized molten adhesive from the pump 150 and distribute said adhesive to one or more outputs 54 at an external portion of the manifold 140. The manifold 140 and some portions of the pump 150 may be integrated as a single structural component (e.g., a manifold block). For example, a fluid chamber 158 portion of the pump 150 may extend into such a common structural component to supply the manifold 140 portions with pressurized molten adhesive. The manifold 140 may be configured with one or more heaters 148 (e.g., heating elements) to maintain the adhesive flowing through the manifold 140 at a specified temperature. The heaters 148 may also serve to re-melt any adhesive material that has cooled within the manifold 140.

The manifold 140 may include an external manifold cover 142 with openings for the outputs 54. The manifold cover 142 may be integral with the manifold 140 or may be separately attachable and detachable. A heated hose 146 may be attached to an output 54 to receive pressurized molten adhesive from the manifold 140 and carry the adhesive to an applicator 144 for dispensing. The applicator 144 and heated hose 146 may be each configured with one or more heaters to maintain the adhesive at a specified temperature. The heaters of the applicator 144 and heated hose 146 may also serve to re-melt any adhesive material that has cooled within the component. The heaters of the applicator 144 and heated hose 146, as well as the heater 148 of the manifold 140, may be in signal communication with the controller 36 to transmit status information (e.g., temperature readings) to the controller 36 and receive control signals from the controller 36. When not connected to an applicator 144, each of the plurality of outputs 54 may be sealed using a plug.

The melt module 12 may comprise a melter subassembly 75, which may define a receiving space 94 that is configured to receive solid material, as well as contain adhesive that has melted. The top wall of the melter subassembly 75 may define an opening 86 in communication with the receiving space 94, such that when the lid assembly 50 is pivoted to an open position, material may be manually deposited into the receiving space 94 through the opening 86, but when the lid assembly 50 is in a closed position, the lid assembly 50 may block introduction of adhesive into the receiving space 94 through the opening 86. The receiving space 94 may define a specific volume that is designed for a particular adhesive operation. For example, the receiving space 94 may be configured to receive 4 kg of adhesive, though other sizes are contemplated.

The melter subassembly 75 may further include a level sensor 98 disposed within the receiving space 94. Particularly, the level sensor 98 may be attached to the inner surface of one of the sidewalls of the melter subassembly 75 and may be in signal communication with the controller 36 of the control module 14. The level sensor 98 may comprise a capacitive level sensor, though other types of level sensors are contemplated. In operation, the level sensor 98 may monitor the level of material within the receiving space 94 and send signals to the controller 36 that are indicative of the adhesive level.

The melter subassembly 75 may further include a heater 114 configured to melt the adhesive. Though depicted as attached to and at least partially extending through the base of the melter subassembly 75, the heater 114 may alternatively or additionally be attached to any portion of the melter subassembly 75. It will be appreciated that the heater 114 may comprise any type of known heating device configured to melt adhesive within a melter assembly. The melter subassembly 75 may further include a plurality of fins 118 extending upwards from the base and into the receiving space 94, where the fins 118 are configured to be heated by the heater 114 and provide an increased surface area for heating and melting the adhesive. Though a particular number, arrangement, and configuration of the fins 118 is shown, it is contemplated that the fins 118 may be alternatively configured as desired. Additionally, an outlet 122 may be defined in the base and in fluid communication with the receiving space 94, where melted adhesive is configured to flow through the outlet 122 and exit the receiving space 94. A cage 130 may be positioned adjacent the outlet 122, where the cage 130 is configured to act as a filter to prevent adhesive pieces of a particular size that are not melted from reaching the outlet 122, as such adhesive pieces may congeal around and clog the outlet 122.

A passage 126 may extend from the outlet 122 to the pump 150 to supply the pump 150 with molten adhesive from the melter subassembly 75. The pump 150 may be a double-acting piston pump, though other types of pumps are contemplated. The pump 150 may operate to expel the molten adhesive from one or more of the outputs 54 via the manifold 140. The pump 150 may be controlled by the controller 36 of the control module 14 to deliver the desired flow rate of molten adhesive through the outputs 54.

Figure 4:
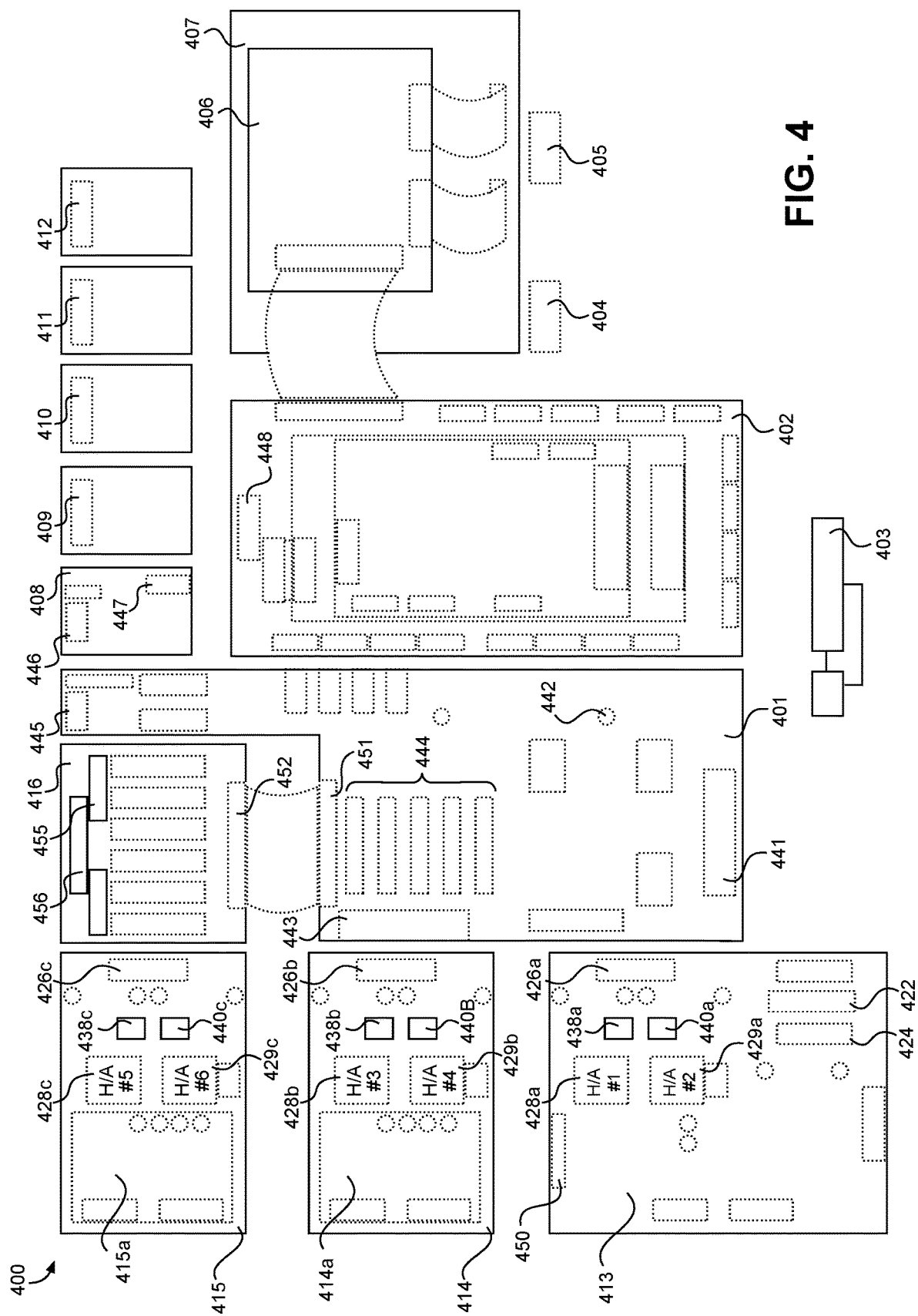
FIG. 4 illustrates a schematic diagram of an electronic circuit board configuration according to an embodiment of the present disclosure.

FIG. 4 illustrates a schematic diagram 400 of various circuit boards (e.g., printed circuit boards (PCBs) or printed circuit assemblies (PCAs)) and other electronic components of the adhesive dispensing device 10 shown in FIGS. 1A-C, 2, and 3. The circuit boards and other components may be mounted within the control module 14, in particular within the control module cover 30. One or more of the circuit boards and other components shown in FIG. 4 may realize the controller 36 shown in FIGS. 2 and 3. Relating to power distribution, the control module 14 includes an on/off switch 405, a power distribution board 401, a chassis ground 403, a DC power supply 408, and a power distribution expansion board 416. Relating to system control, the control module 14 includes a control board 402. For temperature control (and to supply AC power) of the various internal heaters of the melt module 12 and heaters of the attached heated hoses (e.g., the heated hose 146 of FIG. 1B) and applicators (e.g., the applicator 144 of FIG. 1B), the control module 14 includes a first temperature control board 413, a second temperature control board 414, and a third temperature control board 414. For user interaction, the control module 14 includes a user interface (UI) board 406, a membrane switch panel 407, and a USB (universal serial bus) interface 404. Relating to pump operation and control, the control module 14 further includes a pump solenoid valve 409, an air pressure sensor board 410, a pump pressure control valve 411, and a pump direction solenoid valve 412.

A circuit board of the various types described herein may comprise, in some instances, one or more sub-boards. Additionally or alternatively, a circuit board may collectively refer to several integrated circuit boards. A circuit board (including any constituent sub-boards or integrated boards) may be referred to variously herein as a module. For example, the first temperature control board 413 may refer to a temperature control module.

To power the adhesive dispensing device 10 and any connected heated hoses and applicators, the power distribution board 401 receives incoming AC power via an AC connection point 441. A heated hose and applicator pair shall be referred to herein as an "H/A." AC power is provided to the DC power supply 408 via a connection point 445 on the power distribution board 401 and a connection point 446 on the DC power supply 408. The DC power supply 408 thereby provides DC power (e.g., 24V) to the control board 402 via a connection point 447 on the DC power supply 408 and a connection point 448 on the control board 402.

For AC power to the internal heaters of the melt module 12, AC power is sent to the first temperature control board 413 via a connection point 443 on the power distribution board 401 and a connection point 422 on the first temperature control board 413. For AC power to heaters of first and second H/As, AC power is sent to the first temperature control board 413 via the connection point 443 on the power distribution board 401 and a connection point 426a on the first temperature control board 413. Where the system includes more than two applicators (up to six in the embodiment shown), AC power is sent to the power distribution expansion board 416 via a connection point 451 on the power distribution board 401 and a connection point 452 on the power distribution expansion board 416. For AC power to heaters of third and fourth H/As, AC power is sent to the second temperature control board 414 via a connection point 455 on the power distribution expansion board 416 and a connection point 426b on the second temperature control board 414. For AC power to heaters of fifth and sixth H/As, AC power is sent to the third temperature control board 415 via a connection point 456 on the power distribution expansion board 416 and a connection point 426c on the third temperature control board 415.

The power distribution board 401 is configured with a plurality of fuses 444 associated with respective power connections of the power distribution board 401. A fuse of the plurality of fuses 444 may blow if the electric current over the associated power connection exceeds a threshold current. The power distribution board 401, as well as many of the other boards, comprises several indicators, such as LED indicators. The indicators may reflect various conditions and statuses relating to the various electrical circuits of the adhesive dispensing device 10, control signals communicated between the boards and other components of the adhesive dispensing device 10, and the like. As one example, an indicator 442 on the power distribution board 401 may light when AC power is available into the power distribution board 401. Others may light or change color to indicate control signal availability, a board status, power availability, or component status (e.g., a pump status or a heater status), to name some examples.

The control board 402 generally performs control functions for numerous aspects of the adhesive dispensing device 10 and associated components (e.g., H/As). For example, the control board 402 may generate a pump pressure control signal, a control signal to activate or deactivate a fill system, and power relay control signals to the power distribution board 401. The control board 402 may provide a communication interface (wired and/or wireless) with external control systems, such as a cloud control system. The control board 402 may comprise a CPU to execute software or other such computer instructions, such as for heater diagnostics. The control board 402 may be connected to the USB interface 404 to receive, for example, preset settings recipes and to output, for example, event logs.

The UI board 406 and the membrane switch panel 407 may realize the HMI device 34 shown in FIGS. 1A and 1C. The membrane switch panel 407 may receive direct manual input from a user. The UI board 406 may process the user inputs and communicate such inputs to the control board 402. The control board 402, in turn, may put the user input into effect. For example, a user may enter a temperature setpoint for the heater 114 of the melter subassembly 75 using the membrane switch panel 407 and, via the UI board 406, the control board 402 may cause the heater 114 to maintain this temperature setpoint.

The first temperature control board 413 is configured to supply AC power to and control the internal heaters of the melt module 12. Such internal heaters may include heater(s) (e.g., the heater 114) of the melter subassembly 75 that initially melt the adhesive material provided to the receiving space 94. Such internal heaters may also include heater(s) (e.g., the heater 148) within the manifold 140 that maintain the molten adhesive at the specified temperature as it is pumped and distributed to outgoing channels (e.g., the outputs 54) from the manifold 140 to attached H/As. The first temperature control board 413 supplies AC power to the internal heaters via a connection point 424. A temperature input signal from temperature sensors (e.g., resistance temperature detectors (RTDs)) positioned at the internal heaters is received at the first temperature control board 413 via a connection point 450. Based on the temperature input signal for the internal heaters and using one or more controllers (e.g., a PID controller) implemented at the first temperature control board 413, the first temperature control board 413 supplies AC power to the internal heaters to maintain the heaters at respective temperature setpoints (e.g., within respective threshold ranges). The one or more controllers of the first temperature control board 413 may be implemented on a per heater basis. Additionally or alternatively, one controller of the first temperature control board 413 may be for the heater(s) of the melter subassembly 75 and another for the heater(s) of the manifold 140. The AC power may be supplied intermittently (e.g., switched). The respective duty cycles of the internal heaters may be based on the supplied AC power.

The first temperature control board 413 is further configured to supply AC power to and control the respective heaters of a first H/A and a second H/A. The heated hoses of the first and second H/As (as well as other H/As described here) are connected to respective outputs 54 of the manifold 140 to receive molten adhesive. The first temperature control board 413 supplies AC power to the heaters of the first and second H/As via a connection point 428a and a connection point 429a, respectively, of the first temperature control board 413. The connection points 428a, 429a also serve to receive temperature input signals from temperature sensors positioned at the heaters of the first and second H/As, respectively. Thus the connection points 428a, 429a comprise input/output connections. Similar to the internal heater control, the first temperature control board 413 implements one or more controllers (e.g., PID controllers) for the heaters of the first and second H/As that, based on the input temperature control signals, causes AC power to be supplied to the heaters of the first and second H/As, respectively. The AC power to the heaters of the first and second H/As may be supplied intermittently (e.g., switched) and the duty cycles of the respective heaters of the first and second H/As may be based on the AC power supplied to the heaters. The heaters of the first H/A and the heaters of the second H/A may be controlled and supplied power independently of one another. For example, a separate controller may be implemented for each H/A or for each single heater thereof. The controllers may also be implemented on a per applicator or per heated hose basis. A single controller may be implemented to control both the internal heaters and the heaters of the first and second H/As.

With respect to H/A heater control for additional H/As, the second and third temperature control boards 414, 415 may serve similar functions as the first temperature control board 413. That is, the second and third temperature control boards 414, 415 may control the AC power supply to the heaters of associated H/As using separately implemented controllers and based on temperature input signals received from the heaters. Particularly, the second temperature control board 414 is configured with an input/output connection point 428b that receives temperature input signals from temperature sensors of the heaters of a third H/A and outputs an AC power supply to the heaters of the third H/A. The second temperature control board 414 is also configured with an input/output connection point 429b that receives temperature input signals from temperature sensors of the heaters of a fourth H/A and outputs an AC power supply to the heaters of the fourth H/A. The second temperature control board 414 implements one or more controllers to control the AC power supplied (e.g., intermittently) to the heaters of the third and fourth H/As based on respective temperature input signals from the heaters. The duty cycle of a heater of the third or fourth H/A may be set according to the AC power received intermittently from the second temperature control board 414. The power control may cause a heater to reach or maintain a specified temperature setpoint (e.g., a threshold range).

The third temperature control board 415 is similarly configured with input/output connection points 428c, 429c that receive temperature input signals from and supply AC power to respective heaters of fifth and sixth H/As. The third temperature control board 415 implements one or more controllers to control the supply of AC power to the heaters of the fifth and sixth H/As. The heater control is based on the received temperature input signals. The AC power may be supplied intermittently to a heater and may govern the duty cycles of the heater to reach or maintain a specified temperature setpoint (e.g., a threshold range). Other embodiments may include additional temperature control boards to accommodate additional H/As. Yet other embodiments may include only the first temperature control board 413 or only the first and second temperature control boards 413, 414 if less H/As are needed.

The first, second, and third temperature control boards 413, 414, 415 may each comprise one or more sub-boards or PCAs. For example, the first, second, and third temperature control boards 413, 414, 415 may each comprise a base board and an attached or integrated sub-board or PCA. The base board may include connection points to receive AC power from the power distribution board 401 and connection points to provide AC power and control signals to the corresponding heater(s). The sub-board or PCA may implement temperature controls (e.g., a PID controller) for the corresponding heater(s), as well as sending and receiving communication signals from various other boards or components, such as other temperature control boards or the control board 402. The second temperature control board 414 comprises a sub-board or PCA 414a and the third temperature control board 415 comprises a sub-board or PCA 415a.

Each of the first, second, and third temperature control boards 413, 414, 415 are configured with a set of one or more electrical current sensors and/or a set of one or more AC voltage sensors. The first, second, and third temperature control boards 413, 414, 415 each comprise, respectively, a set of [one or more] current sensors 438a,b,c and a set of [one or more] voltage sensors 440a,b,c. The sets of current and/or voltage sensors may be used in direct diagnostics of a heater and associated components and elements (e.g., a heating element, a heater circuit, conductors, wires, PCB traces, connectors, fuses, power control switches, etc.). The current and/or voltage measurements may be taken in real or near-real time for direct heater diagnostics. A current sensor may comprise a current sensor transformer (e.g., a toroid transformer) or an inline current sensor, such as a Hall effect sensor. A voltage sensor may comprise an opto-isolator-based circuit configured to take one or more voltage measurements. A voltage measurement may include an indicator that an AC voltage is present or absent, an AC voltage magnitude, and/or an AC line frequency. Although a set of sensors is represented in FIG. 4 as a single element, a set of current sensors and/or a set of voltage sensors may comprise one or multiple sensor(s) of the respective type.

It will be further appreciated that the diagnostic techniques described herein may be performed based on current measurement (to the exclusion of voltage measurements), voltage measurements (to the exclusion of current measurements), or both current and voltage measurements. Accordingly, although the first, second, and third temperature control boards 413, 414, 415 shown in FIG. 4 are each configured with both current and voltage sensors in this specific example, the disclosure is not so limited and a control board may be configured with only current sensor(s), only voltage sensor(s), or both current sensor(s) and voltage sensor(s).

As noted, the first temperature control board 413 comprises the set of current sensors 438a and the set of voltage sensors 440a. The set of current sensors 438a measures the electric current of the AC power circuit(s) supplying AC power to the internal heaters and the heaters of the first and second H/As connected to the first temperature control board 413. The set of voltage sensors 440a takes voltage measurements (e.g., voltage present/absent, voltage magnitude, and/or AC line frequency) of said AC power circuit(s). In some embodiments, additional sets of current and voltage sensors may be provided to take current and voltage measurements for the AC power circuit(s) supplying AC power to the internal heaters, separate from the current and voltage measurements for the first and second H/As.

The set of current sensors 438a and the set of voltage sensors 440a may each comprise a sensor that takes current and voltage measurements, respectively, of the AC power circuit at the first temperature control board 413 generally. Alternatively, the set of current sensors 438a and the set of voltage sensors 440a may each comprise two sensors: one current sensor and a one voltage sensor to take current and voltage measurements, respectively, of the AC power circuit supplying power to the internal heaters (e.g., at the connection point 422) and a second current sensor and a second voltage sensor to take current and voltage measurements, respectively, of the AC power circuit supplying power to the heaters of the first and second H/As (e.g., at the connection point 426a). Yet further, the set of current sensors 438a and the set of voltage sensors 440a may separately take current and voltage measurements, respectively, of the AC power circuit supplying power to the first H/A (e.g., at the connection point 428a) and current and voltage measurement, respectively, of the AC power circuit supplying power to the second H/A (e.g., at the connection point 429a). That is, the set of current sensors 438a and the set of voltage sensors 440a make take current and voltage measurements on a per-channel basis. Additionally, the current and voltage measurements may be taken on a per-heater basis. The measured current and voltage measurements may be communicated back to the control board 402, for example, for use in direct heater diagnostics.

Similarly, the second temperature control board 414 is configured with the set of current sensors 438b and the set of voltage sensors 440b and the third temperature control board 415 is configured with the set of current sensors 438c and the set of voltage sensors 440c. The set of current sensors 438b and the set of voltage sensors 440b take current and voltage measurements, respectively, of the AC power circuit(s) supplying power to the heaters of the third and fourth H/As connected to the second temperature control board 414. Likewise, the set of current sensors 438c and the set of voltage sensors 440c take current and voltage measurements, respectively, of the AC power circuit(s) supplying power to the heaters of the fifth and sixth H/As connected to the third temperature control board 415. The sets of current sensors 438b,c and the sets of voltage sensors 440b,c may each comprise a single sensor of the respective type and current and voltage measurements may be taken for the AC power circuits at the respective second and third temperature control boards 414, 415 generally (e.g., at the connection points 426b,c). Alternatively, the set of current sensors 438b and the set of voltage sensors 440b on the second temperature control board 414 may each comprise two sensors; a first current sensor and a first voltage sensor may take current and voltage measurements, respectively, of the AC power circuit supplying power to the heater(s) of the third H/A (e.g., at the connection point 428c) and a second current sensor and a second voltage sensor may take current and voltage measurements, respectively, of the AC power circuit supplying power to the heater(s) of the fourth H/A (e.g., at the connection point 429c). The set of current sensors 438c and the set of voltage sensors 440c of the third temperature control board 415 may be configured likewise with respect to the AC power circuits supplying power to the heaters of the fifth and sixth H/As connected to the third temperature control board 415.

It will be appreciated that the first, second, and third temperature control boards 413, 414, 415 realize independent, distributed temperature controls and AC heater power supply for the adhesive dispensing device 10. Numerous benefits are realized by this configuration. For example, the temperature control boards provide electrical isolation between the internal and H/A heaters and the other circuit boards and components of the adhesive dispensing device 10, especially those operating at a relatively low voltage compared to the high-voltage AC power provided to the various heaters (e.g., the low-voltage control board 402). As such, an AC fault in a circuit supplying power to the heaters, the temperature signal line from the temperature sensors, or the temperature control board itself will not propagate past the affected temperature control board, thereby preventing damage to the other boards or components.

Additionally, this temperature control board configuration provides modularity. For instance, if one temperature control board becomes defective, it may be switched out for a new temperature control board with relatively little effort. Nor will the independent temperature and power control aspects of the other temperature control boards be affected. Further, the adhesive dispensing device 10 may be customized to accommodate various numbers of H/As according to present or future needs. As noted, another temperature control board may be added to the configuration shown in FIG. 4 to control additional H/As. Conversely, a temperature control board may be removed if a present application requires a lesser number of H/As.

FIG. 5 illustrates an example data flow diagram 500 relating to direct heater diagnostics that may be used, for example, with the adhesive dispensing device 10 of FIGS. 1A-C, 2, and 3. In particular, heater diagnostics may be performed to determine a state of an electrical circuit supplying power (e.g., AC power) to a heater of, or associated with, the adhesive dispensing device 10. Although discussed primarily in the context of hot melt adhesive, the data flow diagram 500 (and the disclosure generally) may be applicable to any hot melt liquid or hot melt liquid dispensing system.

Initially, one or more current measurements 506 are received from a current sensor 502, such as any of the current sensors 438a,b,c in FIG. 4. Additionally or alternatively, one or more voltage measurements 508 are received from a voltage sensor 504, such as any of the voltage sensors 440a,b,c. As noted above, the diagnostic techniques described herein may be performed using just current sensor(s) 502, just voltage sensor(s) 504, or both current and voltage sensors 502, 504 (and likewise with respect to the current and voltage measurements 506, 508). The current and voltage sensors 502, 504 may be associated with the heater of the adhesive dispensing device 10 or an associated component. For example, the heater may include the heater 114 of the melter subassembly 75, the heater 148 of the manifold 140, a heater of the applicator 144 connected to the adhesive dispensing device 10, or a heater of the heated hose 146 connecting the applicator 144 to the adhesive dispensing device 10. The current measurement 506 may comprise an electric current flow (e.g., amperes) in the electrical heater circuit that supplies electric power to the heater associated with the current sensor 502. The voltage measurements 508 may comprise a voltage present/absent indicator, a voltage magnitude, an AC line frequency, of any combination thereof. The current and voltage measurements 506, 508 may comprise a plurality of measurements, such as measurements taken at regular intervals over a period of time. This may allow predictive analyses, such as to preemptively replace or repair a part before a fault occurs.

The current and voltage sensors 502, 504 may be positioned on the first, second, and/or third temperature control boards 413, 414, 415. Using the first temperature control board 413 as an example, the first temperature control board 413 may define, at least in part, the electrical heater circuit that supplies power to one of the internal heaters or a heater of the first or second H/As connected to the first temperature control board 413. For an internal heater, the electrical heater circuit may comprise the connection point 422 that receives AC power from the power distribution board 401, the connection point 424 to transfer AC power to the internal heater, and one or more heating elements of the internal heater. For a heater of an H/A, the electrical heater circuit may comprise the connection point 426a on the first temperature control board 413 that receive AC power from the power distribution board 401, one of the connection points 428a, 429a on the first temperature control board 413 that transfers AC power to the heater of the H/A, and one or more heating elements of the heater of the H/A. The connection point 422 or 426a via which the first temperature control board 413 receives AC power may be considered the voltage or current source for the electrical heater circuit. The heating element of the heater may be considered the resistive or electrical load that is driven by the voltage or current source.

In some instances, the electrical heater circuit may additionally or alternatively include one or more of the power distribution components on the power distribution board 401. For example, the electrical heater circuit may include one or more applicable fuses of the plurality of fuses 444. As another example, the electrical heater circuit may include the AC connection point 441. If the power distribution expansion board 416 is used, the electrical heater circuit may include power distribution components of that board, including the connection point 452 to receive AC power from the power distribution board 401 (and the corresponding connection point 451 on the power distribution board 401) and the connection points 455, 456 to send AC power to the second and third temperature control boards 414, 415, respectively.

An electrical heater circuit, as used for purposes of heater diagnostics, may be specific to a particular heater. For example, an electrical heater circuit may be specific to a particular channel carrying AC power to heater. The electrical heater circuit may comprise a one-channel electrical heater circuit. Additionally or alternatively, two or more heaters (e.g., for an H/A, the heated hose heater and the applicator heater) may be supplied AC power via a shared electrical heater circuit. For example, the electrical heater circuit may be specific to the 2-channel connection supplying power to a heated hose/applicator pair (an H/A). The electrical heater circuit may comprise a two-channel electrical heater circuit. Additionally or alternatively, all of the heaters connected to a temperature control board may share an electrical heater circuit. For example, an electrical heater circuit associated with the first temperature control board 413 may provide AC power to the heaters of the first H/A, the heaters of the second H/A, and the internal heaters for the melter and manifold. The electrical heater circuit may comprise a four- or six-channel electrical heater circuit.

Based on the current measurements 506 and/or the voltage measurements 508, heater diagnostics 510 are performed to determine the state of the electrical heater circuit (i.e., the heater circuit state 512) for the subject heater. The heater diagnostics 510 may be performed in real or near-real time or the heater diagnostics 510 may be performed at certain defined intervals (e.g., every 10 seconds, every 30 seconds, or every minute). The heater diagnostics 510 may be performed by the controller 36, the control board 402, one or more of the first, second, or third temperature control boards 413, 414, 415, or a remote device (e.g., the remote device 38 of FIG. 1A).

The heater diagnostics 510 may include a comparison of the current measurements 506 to a pre-defined current (e.g., amperes) threshold range. Similarly, the heater diagnostics 510 may include a comparison of the voltage measurements 508 to one or more pre-defined voltage threshold range. The voltage threshold range(s) may be with respect to voltage presence/absence, voltage magnitude, AC line frequency, or a combination thereof. The heater diagnostics 510 may be performed based on the timing of the current and/or voltage measurements 506, 508. For example, AC power to the heater may be intentionally switched on and off intermittently to maintain the heater at a temperature setpoint. The heater diagnostics 510 may include determining if any current is flowing or has flowed over the electrical heater circuit to the heater when the heater is intended to be de-activated.

The heater diagnostics 510 may be performed using a plurality of current and/or voltage measurements 506, 508 over a period of time (i.e., a time series of measurements). For example, using a time series of the current and/or voltage measurements 506, 508, predictive analyses may be performed with respect to current and/or voltage. Predictive analysis may include linear trend estimation, moving average, weighted moving average, or linear regression techniques, as some examples. Based on the time series of the current or voltage measurements 506, 508, a trend or predicted value may be determined in which the current or voltage measurement 506, 508 is expected to fall outside of a corresponding threshold range. Additionally or alternatively, a rate of change for the current or voltage measurements 506, 508 over the time series may be determined and compared against a corresponding threshold range.

While the heater diagnostics 510 may be performed based on only one of the current measurements 506 or the voltage measurements 508, it may be beneficial in some instances that the heater diagnostics 510 make use of both such measurements. For example, a current measurement 506 of zero amps may be caused by a problem with a heater's heating element or associated wiring or may be caused by any one of various problems relating to voltage supply, such as a blown fuse, a disconnected AC power connection from the power distribution board 401, or a failure at the external AC power source. But by using both the current measurements 506 and the voltage measurements 508, the heater diagnostics 510 may eliminate the latter voltage supply problems as potential causes of the lack of current (assuming that the voltage measurements 508 do indeed indicate a proper voltage in the heater circuit). That is, the heater diagnostics 510 may separate any problems with the source voltage supply from the problems with the load (e.g., a heater element) attached to it and vice versa. Additionally, the heater diagnostics 510 may be performed using voltage measurements 508 for two or more of a voltage present/absent indicator, a voltage magnitude, or an AC line frequency.

The heater circuit state 512 is determined using the heater diagnostics 510. The heater circuit state 512 may indicate various fault conditions relating to the electrical heater circuit for the heater. For example, the heater circuit state 512 may indicate that the current in the electrical heater circuit is outside of (e.g., exceeds or is below) the current threshold range. Similarly, the heater circuit state 512 may indicate that the voltage magnitude or the AC line frequency in the heater circuit is outside of (e.g., exceeds or is below) a corresponding voltage threshold range. The heater circuit state 512 may indicate whether there is voltage present or absent in the heater circuit.

The heater circuit state 512 may indicate additional fault conditions relating to excessive, insufficient, or absent current or voltage. For example, the heater circuit state 512 may indicate a blown/failed fuse, such as one of the fuses of the plurality of fuses 444 on the power distribution board 401, a fuse on one of the first, second, or third temperature control boards 413, 414, 415, or a fuse on the power distribution expansion board 416. A blown fuse may be associated with a lack of measured voltage and current at respective voltage or current sensors.

As another example, the heater circuit state 512 may indicate an open heater element of the heater or a disconnected or broken wire from one of the first, second, or third temperature control boards 413, 414, 415 to the heater. Such an open heater element or disconnected or broken wire may be associated with a presence of voltage at the voltage sensor and too low of current (including an absence of current or current very near zero) across the heater element.

As another example, the heater circuit state 512 may indicate an intermittent fault, including an intermittent wire fault in a connection between one of the first, second, or third temperature control boards 413, 414, 415 and the associated heater or an intermittent wire fault in the AC voltage supply. Such an intermittent fault may be associated with intermittent or fluctuating current and/or voltage readings. For instance, the current and/or voltage measurements 506, 508 may indicate the presence of current and/or voltage at unintended times, alone or in combination with the presence of current and/or voltage at intended times.

As another example, the heater circuit state 512 may indicate an overload to a TRIAC (TRIode for Alternating Current) circuit of the heater circuit. The overload to a TRIAC circuit may be associated with excessive current (e.g., current across the heater element). The heater circuit state 512 may indicate a shorted TRIAC, which may be associated with current flow at unintended times. As another example, the heater circuit state 512 may indicate an incorrect AC line frequency.

As another example, the heater circuit state 512 may indicate a predicted fault condition (including a probability interval for such a predicted fault condition). The predicted fault condition may be based on predictive analysis performed in the heater diagnostics 510. Relatedly, the heater circuit state 512 may indicate a trend in the current and/or voltage measurements 506, 508 over a period of time. As such, the heater circuit state 512 may indicate a predicted time of failure for a component of the adhesive dispensing device 10, such as those relating to heater power and control. For instance, a predicted time of failure may be for a heating element. A predicted fault condition, trend, or predicted time of component failure may be used in performing preventive maintenance, repair, or replacement.

The heater circuit state 512 is not limited to only fault conditions but may also include a condition of the heater circuit generally (e.g., intended or non-fault conditions). For example, the heater circuit state 512 may indicate that the current or voltage measurements 506, 508 are within acceptable threshold ranges. As a further example, the heater circuit state 512 may indicate that a predicted condition is within an acceptable threshold range or that a current or voltage trend is flat or stable.

Based on the heater circuit state 512, a notification 514 may be generated. The notification 514 may indicate the heater circuit state 512. Some heater circuit states 512 may warrant the notification 514 while others may not. For example, the notification 514 may be generated when the heater circuit state 512 indicates a fault condition. But no notification 514 may be generated when the heater circuit state 512 indicates a non-fault condition.

The notification 514 may be in the form of an email or text message, such as to an operator or other production facility personnel. The notification 514 may be in the form of an alert or message on the HMI device 34 of the adhesive dispensing device 10 to notify the operator. The notification 514 may also be in the form of an audio alert. The notification 514 may prompt the operator to take corrective action, particularly when the heater circuit state 512 may cause damage to the adhesive dispensing device 10. For example, excess current flowing through a heater element may cause damage to the heater element.

The adhesive dispensing device 10 and/or any external controllers may initiate corrective action based on the heater circuit state 512, particularly when the heater circuit state 512 indicates a fault condition. For example, an applicator may be automatically deactivated if a fault associated with the heater of the applicator or attached heated hose is identified. Since the temperature control and AC power supply to the heaters are independently distributed among the first, second, and third temperature control boards 413, 414, 415, corrective action (e.g., deactivation) may be taken with respect to only one or two of the first, second, and third temperature control boards 413, 414, 415 without affecting the function of the others. For example, if a damaging fault condition associated with the second temperature control board 414 is indicated, the AC power supply to the second temperature control board 414 may be cut off while AC power may be still supplied to the first and third temperature control boards 413, 415.

FIG. 6 illustrates an example method flow diagram of a method 600 for performing, at least in part, direct heater diagnostics with respect to a hot melt liquid dispensing system (e.g., the adhesive dispensing device 10 of FIGS. 1A-C, 2, and 3). Such diagnostics may relate to a heater generally, but may also relate to—and identify faults in—the various components, sub-components, and other elements that are associated with a heater of a hot melt liquid dispensing system. This includes, as examples, heating elements, a heater circuits, conductors, wires, traces (e.g., PCB copper traces), connectors, fuses, power control switches, etc. The hot melt liquid dispensing system may include a melter (e.g., the melt module 12 or melter subassembly 75) configured to melt solid or semi-solid material into hot melt liquid and a pump (e.g., the pump 150) configured to pump the hot melt liquid to an associated applicator (e.g., the applicator 144). The method may be performed, at least in part, by a controller of the hot melt liquid dispensing system, such as the controller 36 of FIG. 3, the control board 402 of FIG. 4, one or more of the first, second, or third temperature control boards 413, 414, 415 of FIG. 4, or the remote device 38 of FIG. 1A.

At step 602, at least one of a current measurement or a voltage measurement is received. The current measurement and/or voltage measurements may be associated with an electrical circuit configured to supply electrical power (e.g., AC power) to a heater associated with the hot melt liquid dispensing system ("dispensing system") is received. The current measurement may be received from a current sensor (e.g., one of the current sensors 438$a,b,c$ of FIG. 4) positioned at the electrical circuit. The current measurement may indicate the ampere(s) flowing across the electrical circuit. The current measurement may comprise a plurality of current measurements. The current measurement may be taken at regular time intervals, thus making the current measurement a times series of current readings.

The voltage measurement may be received from a voltage sensor (e.g., one of the voltage sensors 440*a,b,c* of FIG. 4) positioned at the electrical circuit. The voltage measurement may comprise one or more of a voltage magnitude, a voltage presence/absence, or an AC line frequency. The voltage measurement may comprise a plurality of voltage measurements. The voltage measurement may be taken at regular time intervals, thus making the voltage measurement a times series of voltage readings. The current measurement and the voltage measurement may be taken at the same time(s) as one another or may be taken at different time(s).

The heater may comprise a heater of the applicator, a heater of a heated hose (e.g., the heated hose 146) configured to carry hot melt liquid to the applicator, a heater of the melter, or a heater of a manifold (e.g., the manifold 140) of the dispensing system configured to direct the hot melt liquid from the pump to the applicator.

At step 604, a state of the electrical circuit (e.g., the heater circuit state 512 of FIG. 5) is determined based on the at least one of the current measurement or the voltage measurement. In some embodiments, the state of the electrical circuit may be determined based on both the current measurement and the voltage measurement. The state of the electrical circuit may be determined according to the heater diagnostics 510 of FIG. 5. The state of the electrical circuit may be determined by comparing the current and/or voltage measurement(s) to pre-defined current and/or voltage threshold ranges, respectively. Determining the state of the electrical circuit may comprise performing a predictive analysis with respect to at least one of the current or voltage measurements. For example, determining the state of the electrical circuit may comprise determining a rate of change of at least one of the current or voltage measurements over a period of time. Determining the rate of change of the current and/or voltage measurements may reveal a trend in the current and/or voltage measurements from which a predicted current or voltage measurement may be determined.

The state of the electrical circuit may comprise one or more of a blown fuse, a disconnected wire, a broken wire, an intermittent fault, a voltage magnitude outside of a threshold range, an AC line frequency outside of a threshold range, an open heater element of the heater, a current outside of a threshold range, and current flow occurring outside of a pre-defined time period.

In some embodiments, the dispensing system may comprise a power distribution module (e.g., the power distribution board 401 of FIG. 4), a low voltage control module (e.g., the control board 402), and a temperature control module (e.g., the first, second, or third temperature control boards 413, 414, 415). The temperature control module may be connected to the heater. The temperature control module may perform temperature control functions (e.g., a PID controller) for the heater based on temperature readings from a temperature sensor of the heater. The temperature control module may supply (and control) the power to the heater. The operation of the heater (e.g., duty cycle) may be controlled by switching or intermittently supplying power to the heater. The current and voltage sensors may be disposed on the temperature control module. The temperature control module may implement or define, at least in part, the electrical circuit supplying power to the heater. For example, the temperature control module may comprise a power connection point to receive power from the power distribution module and a power connection point to transfer power to the heater. The electrical circuit may comprise these two power connection points, as well the heater itself (e.g., the heating element) and the wire connections (e.g., power and temperature control connections) between the temperature control module and the heater. The electrical circuit may comprise the wire connection(s) between the temperature sensor(s) at the heater and the temperature control module. The electrical circuit may comprise power supply elements on the power distribution module, including a power input from an external power source, a power connection point to the temperature control module, and various fuses associated with the power supply to the temperature control module and/or heater.

The method 600 may further comprise generating a notification (e.g., the notification 514 of FIG. 5) based on the state of the electrical circuit. The notification may indicate the state of the electrical circuit. The notification may comprise an email, a text message, a notification or indicator on a user interface of the dispensing system or remote control system, or an audio alert.

One skilled in the art will appreciate that the systems and methods disclosed herein may be implemented via a computing device that may comprise, but are not limited to, one or more processors, a system memory, and a system bus that couples various system components including the processor to the system memory. For example, a computing device (e.g., a controller) may comprise one or more processors and memory storing instructions that, when executed by the one or more processors, cause the computing device to perform one or more of the methods or techniques described herein, such as the method 600.

For purposes of illustration, application programs and other executable program components such as the operating system are illustrated herein as discrete blocks, although it is recognized that such programs and components reside at various times in different storage components of the computing device, and are executed by the data processor(s) of the computer. An implementation of service software may be stored on or transmitted across some form of computer readable media. Any of the disclosed methods may be performed by computer readable instructions embodied on computer readable media. Computer readable media may be any available media that may be accessed by a computer. By way of example and not meant to be limiting, computer readable media may comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by a computer. Application programs and the like and/or storage media may be implemented, at least in part, at a remote system.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

It will be apparent to those skilled in the art that various modifications and variations may be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A hot melt liquid dispensing system, comprising:
   a melter comprising at least one internal heater configured to melt solid or semi-solid material into a hot melt liquid;
   at least one heater implemented by at least one or more of an adhesive applicator, an adhesive manifold, and/or a heated adhesive hose;
   an electrical circuit associated with the hot melt liquid dispensing system, the electrical circuit comprising a plurality of temperature control circuits;
   each of the plurality of temperature control circuits comprising a set of current sensors and a set of voltage sensors;
   the set of current sensors configured to measure currents of a power supplied to the at least one internal heater and/or the at least one heater;
   the set of voltage sensors configured to measure voltages of a power supplied to the at least one internal heater and/or the at least one heater; and
   a controller configured to:
   receive over a period of time, from the set of current sensors and the set of voltage sensors, a time series of current measurements and a time series of voltage measurements, and
   perform a diagnostic test using the time series of current measurements and the time series of voltage measurements to determine a state of the electrical circuit,
   wherein the diagnostic test includes one or more comparisons between the time series of current measurements with a predefined current threshold range of values and wherein the diagnostic test includes one or more comparisons between the time series of voltage measurements with a predefined voltage threshold range of values, and the diagnostic test determines, based on the one or more comparisons, whether the state of the electrical circuit comprises a fault condition; and
   wherein in response to the state of the electrical circuit comprising the fault condition, the controller is configured to apply a corrective action to at least one of the plurality of temperature control circuits.

2. The hot melt liquid dispensing system of claim 1,
   wherein the at least one heater is configured with the adhesive applicator of the hot melt liquid dispensing system;
   wherein another implementation of the at least one heater is configured with the heated adhesive hose;
   wherein the heated adhesive hose is connected to the hot melt liquid dispensing system, the melter, and/or the adhesive manifold of the hot melt liquid dispensing system; and
   wherein the heated adhesive hose is configured to direct the hot melt liquid from a pump of the hot melt liquid dispensing system to the adhesive applicator.

3. The hot melt liquid dispensing system of claim 1,
   wherein the fault condition of the electrical circuit comprises one or more of: a blown fuse, a disconnected wire, a broken wire, an intermittent fault, a voltage magnitude outside of a threshold range, an AC line frequency outside of a threshold range, an open heater element of the at least one heater and/or the at least one internal heater, a current outside of a threshold range, and a current flow occurring outside of a pre-defined time period.

4. The hot melt liquid dispensing system of claim 1,
   wherein the controller is configured to perform the diagnostic test to determine a rate of change of at least one of the time series of current measurements or the time series of voltage measurements over a period of time; and
   wherein the rate of change is compared against a corresponding threshold range to determine a trend or predicted value in which the current measurement or the voltage measurement is expected to fall outside of the corresponding threshold range.

5. The hot melt liquid dispensing system of claim 1,
   wherein the electrical circuit further comprises a temperature control module connected to one of the at least one heater and/or the at least one internal heater; and
   wherein the temperature control module is configured to supply an electric power to one of the at least one heater and/or the at least one internal heater.

6. The hot melt liquid dispensing system of claim 5,
   wherein the temperature control module comprises a temperature controller, and
   wherein the temperature controller controls the electric power supplied to the at least one heater and/or the at least one internal heater based on temperature signals received from temperature sensors associated with the at least one heater and/or the at least one internal heater.

7. The hot melt liquid dispensing system of claim 1, wherein the time series of voltage measurements comprise at least one of a voltage magnitude, a voltage presence/absence, and/or an AC line frequency.

8. The hot melt liquid dispensing system of claim 1,
   wherein the controller is further configured to send a notification based on the state of the electrical circuit; and
   wherein the notification comprises an alert or message generated on a human machine interface device.

9. The hot melt liquid dispensing system of claim 1, wherein, after the diagnostic test, the controller is configured to determine a future fault condition of the electrical circuit.

10. The hot melt liquid dispensing system of claim 9, wherein the controller is configured to determine when a future current measurement or a future voltage measurement is expected to be outside of the predefined current threshold range of values or the predefined voltage threshold range of values.

11. The hot melt liquid dispensing system of claim 9, wherein the controller is configured to determine when a rate of change of a current or a voltage is expected to be outside of the predefined current threshold range of values or the predefined voltage threshold range of values.

12. The hot melt liquid dispensing system of claim 9, wherein the controller is configured to determine a future fault condition based on at least one of: a linear trend estimation, a moving average, a weighted moving average, and linear regression techniques.

13. The hot melt liquid dispensing system of claim 1, wherein the controller is configured to receive a plurality of current measurements or a plurality of voltage measurements, and the controller is configured to perform the diagnostic test using the plurality of the time series of current measurements or the plurality of voltage measurements.

14. The hot melt liquid dispensing system of claim 1, wherein the fault condition includes excessive current or voltage that is greater than the predefined current threshold range of values or the predefined voltage threshold range of values or insufficient current or voltage that are lower than the predefined current threshold range of values or the predefined voltage threshold range of values.

15. The hot melt liquid dispensing system of claim 1, wherein the controller is configured to take corrective action that comprises deactivating components associated with the fault condition.

16. The hot melt liquid dispensing system of claim 1,
wherein the controller is configured to perform the diagnostic test to determine a rate of change of at least one of the time series of current measurements or the time series of voltage measurements over a period of time;
wherein the rate of change is compared against a corresponding threshold range to determine a trend or predicted value in which the current measurement or the voltage measurement is expected to fall outside of the corresponding threshold range; and
wherein the controller is configured to determine a predicted time of failure for a component of the hot melt liquid dispensing system.

17. A method comprising:
receiving from a set of current sensors and a set of voltage sensors, a time series of current measurements and a time series of voltage measurements associated with an electrical circuit configured to supply electric power to at least one internal heater and at least one heater associated with a hot melt liquid dispensing system;
performing one or more comparisons between the time series of current measurements with a predefined current threshold range of values and between the time series of voltage measurements with a predefined voltage threshold range of values; and
performing, using the comparison, a diagnostic test to i) determine a condition indicative of a fault condition of the electrical circuit and ii) predict a future measurement expected to be outside of the predefined current threshold range of values and/or the predefined voltage threshold range of values based on a rate of change of measurements over time.

18. The method of claim 17, further comprising:
implementing the at least one internal heater in a melter configured to melt solid or semi-solid material into hot melt liquid;
implementing the at least one heater in at least one of an adhesive applicator, an adhesive manifold, and/or a heated adhesive hose;
implementing the electrical circuit with a plurality temperature control circuits; and
implementing each of the plurality temperature control circuits with one or more of the set of current sensors and the set of voltage sensors.

19. The method of claim 17,
wherein performing the diagnostic test comprises determining a rate of change of the time series of current measurements and the time series of voltage measurements over a period of time; and
wherein the rate of change is compared against a corresponding threshold range to determine a trend or predicted value in which the current measurement or the voltage measurement is expected to fall outside of the corresponding threshold range.

20. The method of claim 17, further comprising controlling the electric power supplied to the at least one internal heater and the at least one heater using a temperature controller based on a temperature signal received from a temperature sensor associated with the at least one internal heater or the at least one heater.

21. The method of claim 17, further comprising generating a notification based on the condition,
wherein the notification comprises an alert or message generated on a human machine interface device.

22. The method of claim 17,
wherein performing the diagnostic test comprises determining a rate of change of the time series of current measurements and the time series of voltage measurements over a period of time; and
wherein the rate of change is compared against a corresponding threshold range to determine a trend or predicted value in which the current measurement or the voltage measurement is expected to fall outside of the corresponding threshold range.

23. A controller associated with a hot melt liquid dispensing system, the controller comprising:
one or more processors; and
a memory storing instructions that, when executed by the one or more processors, cause the controller to:
receive from a set of current sensors and a set of voltage sensors, a time series of current measurements and a time series of voltage measurements associated with an electrical circuit configured to supply electric power to at least one internal heater and at least one heater associated with a hot melt liquid dispensing system; and
perform a diagnostic test using the time series of current measurements and the time series of voltage measurements to determine a heater circuit state of the electrical circuit,
wherein the diagnostic test includes i) a first comparison between the time series of current measurements and a predefined current threshold range of values and ii) a second comparison between the time series of voltage measurements and a predefined voltage threshold range of values;
wherein the diagnostic test determines, based on the first comparison and the second comparison, whether the heater circuit state comprises a fault condition; and
wherein in response to the diagnostic test determining the fault condition, apply a corrective action to at least one temperature control circuit.

24. The controller of claim 23, wherein the corrective action comprises deactivating at least one temperature control circuit while supplying the electric power to another temperature control circuit.

25. The controller of claim 23,
 wherein at least one of the set of current sensors or the set of voltage sensors are disposed on a temperature control module;
 wherein the at least one internal heater is implemented in a melter configured to melt solid or semi-solid material into hot melt liquid; and
 wherein the at least one heater is implemented in at least one of an adhesive applicator, an adhesive manifold, and/or a heated adhesive hose.

26. The controller of claim 23,
 wherein the controller is configured to perform the diagnostic test to determine a rate of change of at least one of the time series of current measurements or the time series of voltage measurements over a period of time;
 wherein the rate of change is compared against a corresponding threshold range to determine a trend or predicted value in which the current measurement or the voltage measurement is expected to fall outside of the corresponding threshold range; and
 wherein the controller is configured to determine a predicted time of failure for a component of the hot melt liquid dispensing system.

* * * * *